United States Patent
McLauchlan et al.

(10) Patent No.: US 7,307,495 B2
(45) Date of Patent: Dec. 11, 2007

(54) ELECTRICAL FILTER ASSEMBLY HAVING IDC CONNECTION

(75) Inventors: Raymond Bruce McLauchlan, Macomb Township, MI (US); William R. Lyons, West Bloomfield, MI (US); Joshy Thomas, Rochester Hills, MI (US); Richard A. Schmidt, Jr., Redford, MI (US); Michael S. Glick, Farmington Hills, MI (US); Phillip G. Seminara, Farndale, OH (US); Cecil Brown, Detroit, MI (US)

(73) Assignee: FCI Americas Technology, Inc., Reno, NV (US)

( * ) Notice: Subject to any disclaimer, the term of this patent is extended or adjusted under 35 U.S.C. 154(b) by 274 days.

(21) Appl. No.: 11/146,493

(22) Filed: Jun. 6, 2005

(65) Prior Publication Data

US 2005/0280484 A1    Dec. 22, 2005

Related U.S. Application Data

(60) Provisional application No. 60/580,861, filed on Jun. 17, 2004, provisional application No. 60/580,860, filed on Jun. 17, 2004.

(51) Int. Cl.
*H03H 7/00* (2006.01)

(52) U.S. Cl. .................................. 333/185; 333/184
(58) Field of Classification Search ............... 333/184, 333/185
See application file for complete search history.

(56) References Cited

U.S. PATENT DOCUMENTS 6,623,275 B1 * 9/2003 Pavlovic et al. .............. 439/38

FOREIGN PATENT DOCUMENTS

EP            1569249 A1 *   8/2005

* cited by examiner

*Primary Examiner*—Robert Pascal
*Assistant Examiner*—Kimberly E Glenn
(74) *Attorney, Agent, or Firm*—Harrington & Smith, PC (57) ABSTRACT

An electrical filter assembly including a housing; at least one electrical wire extending into the housing; and a filter subassembly on the housing, the filter subassembly comprising a lead frame and a filter circuit connected to the lead frame. The filter circuit has a plurality of capacitors attached to the lead frame as a modular block. The lead frame comprises at least one insulation displacement contact section which makes electrical connection with the at least one electrical wire.

21 Claims, 8 Drawing Sheets

ELECTRICAL FILTER ASSEMBLY HAVING IDC CONNECTION

CROSS REFERENCE TO RELATED APPLICATION

This application claims priority under 35 U.S.C. §119(e) to U.S. Provisional Patent Application No. 60/580,861 filed Jun. 17, 2004, and U.S. Provisional Patent Application No. 60/580,860 filed Jun. 17, 2004, which are hereby incorporated by reference in their entireties.

BACKGROUND OF THE INVENTION

1. Field of the Invention

The present invention relates to an electrical filter assembly and, more particularly, to an electrical filter assembly having a filter subassembly with an insulation displacement contact (IDC) connection.

2. Brief Description of Prior Developments

U.S. Pat. No. 5,099,762 discloses an electrostatic discharge immune electric initiator. U.S. Pat. No. 6,276,953 discloses an orientationless squib connector assembly for automotive air bag assemblies. For a filtered connector intended to be used in a small space, such as an automobile air bag connector, increasing the size of the connector is not desired. U.S. Pat. No. 6,152,775, which is hereby incorporated by reference in its entirety, discloses a filtered electrical connector with multiple ferrite members.

Air bag electrical connectors which use ferrite hoods are good for filtering electromagnetic interference around 500 MHz. However, automobiles are now being provided with electronics, such as mobile telephones and Global Positioning System (GPS) devices which can generate electromagnetic interference in the area of about 2-4 GHz. This electromagnetic interference can induce current in conductors leading to an air bag gas generator and cause an accidental discharge of the gas generator. There is a need to provide an air bag connector which can filter electromagnetic interference above 2 GHz and thereby prevent accidental discharge of an air bag gas generator from such interference.

SUMMARY OF THE INVENTION

A filter subassembly can be provided having a filter circuit module, such as a chip, which is attached to a lead frame. The lead frame preferably has an insulation displacement connection (IDC) section to attach the filter subassembly to a wire.

In accordance with one aspect of the present invention, an electrical filter assembly is provided comprising a housing; at least one electrical wire extending into the housing; a filter subassembly on the housing. The filter subassembly comprises a lead frame and a filter circuit connected to the lead frame. The filter circuit has a plurality of capacitors attached to the lead frame. The lead frame comprises at least one insulation displacement contact (IDC) section which makes electrical connection with the at least one electrical wire.

In accordance with another aspect of the present invention, sn electrical filter subassembly id provided comprising a lead frame comprising an electrically conductive section with a wire connection section and a filter circuit connection section, wherein the wire connection section comprises at least one insulation displacement connection (IDC) section adapted to pierce through insulation of at least one wire to contact an electrical conductor of the at least one wire; and a filter circuit module connected to the filter circuit connection section of the lead frame, wherein the filter circuit module comprises a plurality of capacitors.

In accordance with one method of the present invention, a method of coupling a filter to an electrical wire is provided comprising steps of providing an electrical filter subassembly comprising a lead frame and a filter circuit module, wherein the lead frame comprises an insulation displacement connection (IDC) section adapted to pierce through insulation of a wire to contact an electrical conductor of the wire, and wherein the filter circuit module comprises a plurality of capacitors electrically coupled to the lead frame; and inserting the wire into the IDC section of the lead frame comprising the IDC section piercing through the insulation of the wire to contact the electrical conductor of the wire and thereby couple the capacitors of the filter circuit module to the electrical conductor of the wire.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENTS

Figure 1:
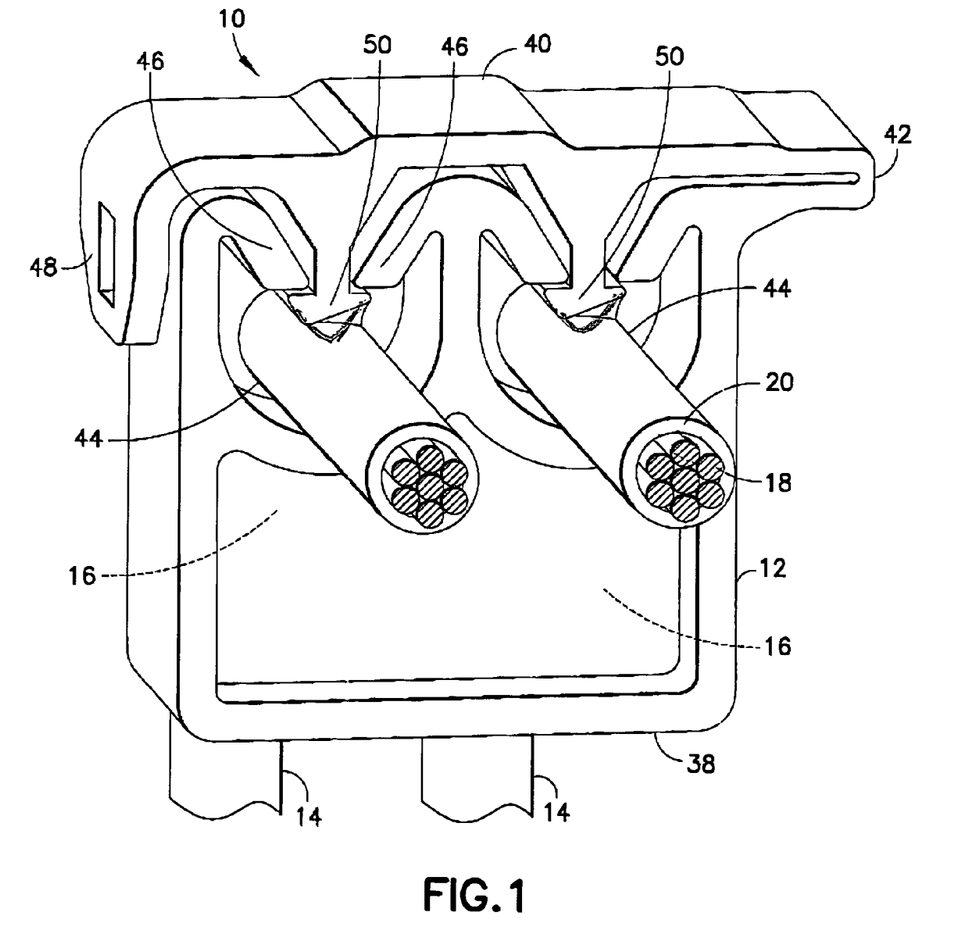
FIG. 1 is a perspective view of a filter assembly incorporating features of the present invention.

Referring to FIG. 1, there is shown a perspective view of an electrical filter assembly 10 incorporating features of the present invention. Although the present invention will be described with reference to the exemplary embodiments shown in the drawings, it should be understood that the present invention can be embodied in many alternate forms of embodiments. In addition, any suitable size, shape or type of elements or materials could be used.

The filter assembly 10 could have its wires connected to an electrical connector such as an automobile air bag connector. U.S. patent application Ser. No. 10/359,843 filed Feb. 7, 2003, which is hereby incorporated by reference in its entirety, describes an electrical filter connector assembly including a housing, electrical contact terminals, and a capacitive filter circuit. The housing is sized and shaped to be plugged into a socket of a gas generator. The housing includes at least one contact receiving hole. The electrical contact terminals each have a wire connection section and a female connection section. The terminals are located in the at least one contact receiving hole. The capacitive filter circuit is connected on the wire connection section of a first one of the terminals for providing electromagnetic induction suppression. Features of the present invention could be incorporated into an electrical connector.

Figure 2:
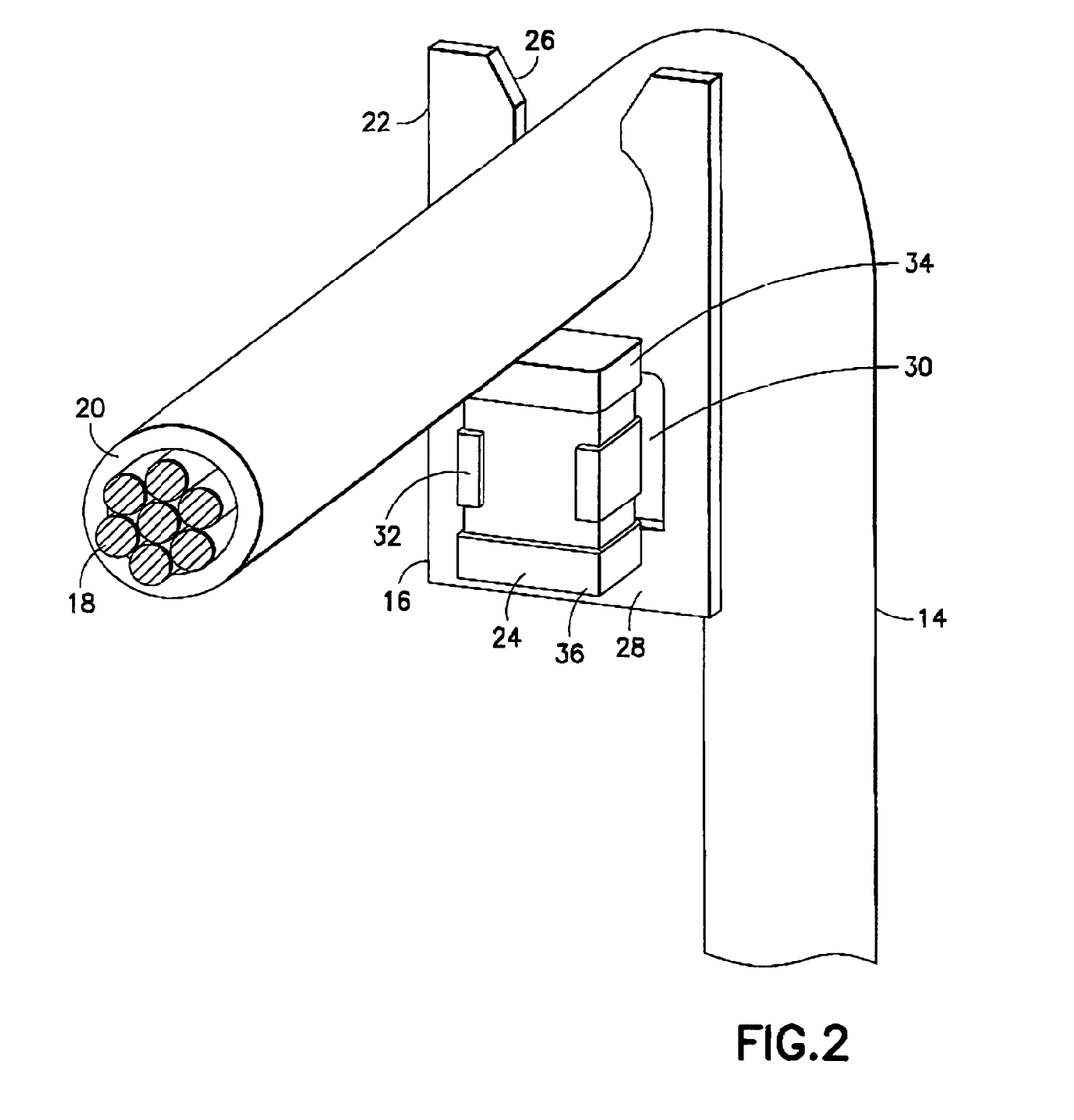
FIG. 2 is a perspective view of a filter subassembly of the filter assembly shown in FIG. 1 attached to one of the wires.
Figure 3:
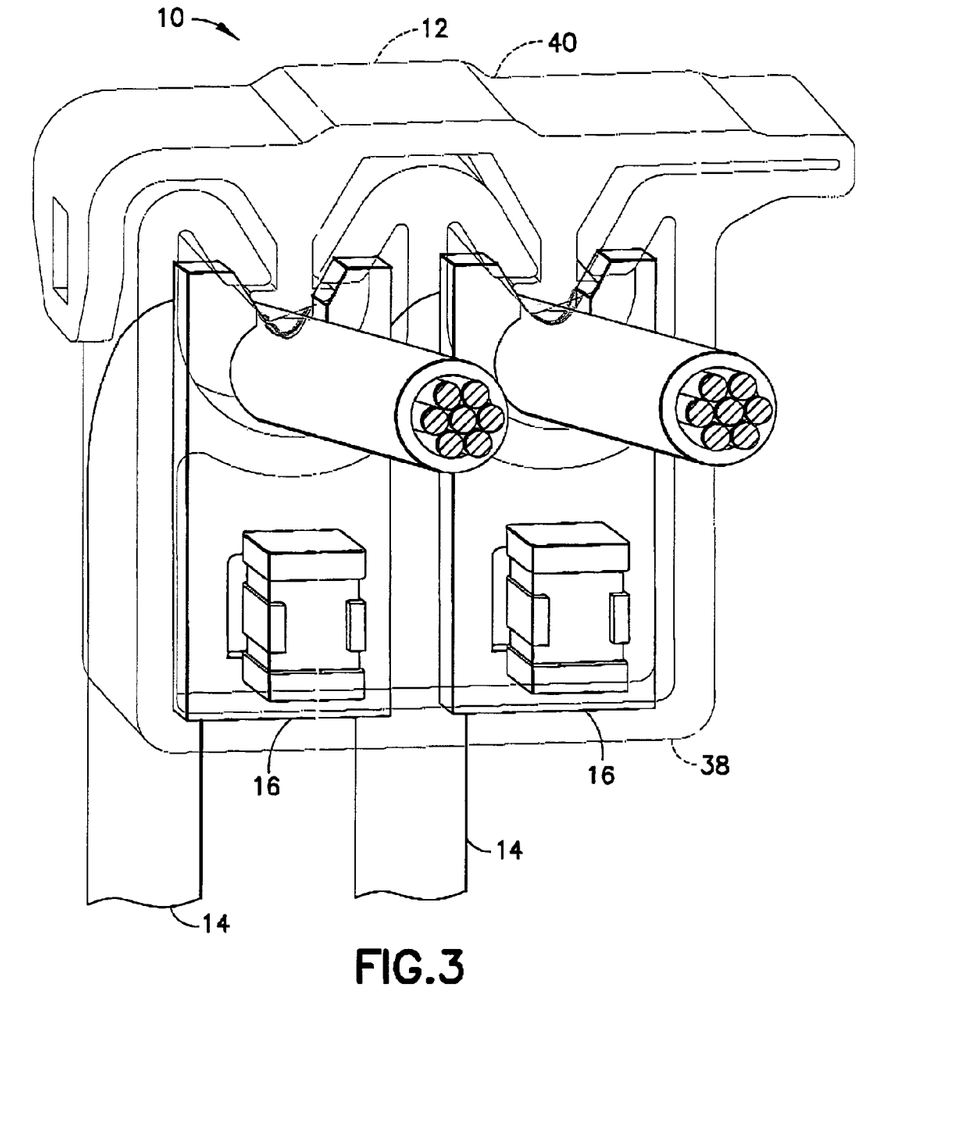
FIG. 3 is a perspective view showing the wires and filter subassemblies of the filter assembly shown in FIG. 1.
Figure 4:
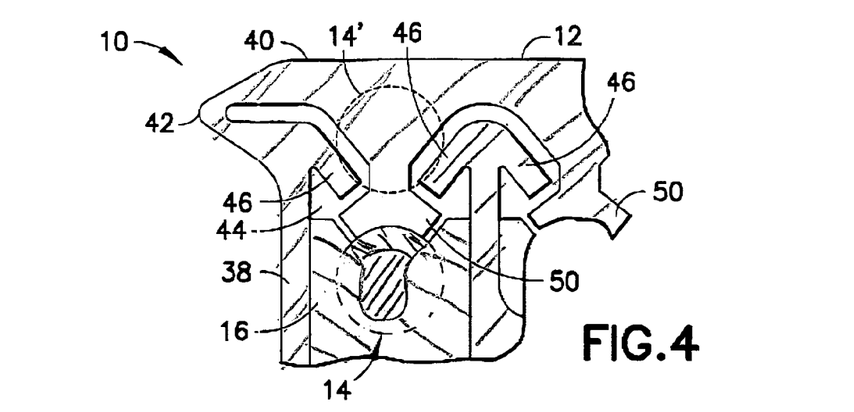
FIG. 4 is a cross sectional view of a portion of the filter assembly shown in FIG. 1.

Referring also to FIGS. 2-4, the filter assembly 10 generally comprises a housing 12, electrical wires 14, and filter subassemblies 16. In this embodiment the filter assembly 10 comprises two of the electrical wires 14. However, in alternate embodiments, the filter assembly could comprise more or less than two electrical wires. Each electrical wire 14 comprises an electrical conductor 18 and a cover 20. The cover 20 is comprised of electrical insulating material, such as a resilient polymer material.

In this embodiment the filter assembly 10 comprises two of the filter subassemblies 16. However, in alternate embodiments, the filter assembly could comprise more or less than two filter subassemblies. In this embodiment the filter subassemblies 16 are identical to each other. However, in alternate embodiments, the filter subassemblies could be different. As seen best in FIG. 3, each subassembly 16 is coupled to a respective one of the wires 14. As seen best in FIG. 2, each filter subassembly 16 generally comprises a contact or lead frame 22 and a filter circuit 24. The lead frame 22 is preferably comprised of sheet metal which has been stamped to form the shape shown. The lead frame 22 comprises a wire connection section 26 and a filter circuit connection section 28. The wire connection section 26 comprises an insulation displacement contact (IDC) section. When the wire 14 is pressed through the top of the wire connection section 26, portions of the wire connection section 26 cut through the cover 20 and make electrical connection with the electrical conductor 18.

In the embodiment shown, the filter circuit connection section 28 comprises a hole 30. The filter circuit 24 is attached to the lead frame 22 at the filter circuit connection section 28. In a preferred embodiment, the filter circuit 24 is surface mounted onto the lead frame 22, such as by a solder. This mechanically and electrically connects the filter circuit 24 to the lead frame 22. In an alternate embodiment, any suitable type of system for connecting the filter circuit 24 to the lead frame 22 could be provided so long as the ground contact 32 of the filter circuit 24 is electrically insulated from the lead frame. In the embodiment shown, the hole 30 provides an air insulator between the ground contact 32 and the lead frame 22. The other two contacts 34, 36 of the filter circuit 24 are electrically coupled to the lead frame by their surface mounting on the lead frame. The ground contact 32 can be coupled to ground through a member (not shown) insulated from the lead frame.

The filter circuit 24 preferably comprises multiple capacitors. In a preferred embodiment the filter circuit 24 comprises two groups of capacitors. The first group of capacitors comprises two capacitors connected in series. The second group of capacitors comprises a single capacitor. The first group of capacitors is connected in parallel with the second group of capacitors. However, in alternate embodiments, the filter circuit could comprise more or less capacitors and the capacitors could be arranged in any suitable type of circuit configuration.

The housing 12 generally comprises a base section 38 and a cover section 40. The housing 12 is preferably comprised of a molded plastic or polymer material which is electrically insulative. The cover section 40 is connected to the base section 38 by a living hinge 42. However, in an alternate embodiment, the cover section could be a separate member from the base section. The base section 38 comprises wire receiving areas 44 with entrances through a top side of the base section. Each wire receiving area 44 comprises deflectable snap lock latch sections 46 extending downward at the top of the wire receiving areas 44.

The base section 38 is connected to the filter subassemblies 16, such as being overmolded onto the subassembly 16, such that the wire connection sections 26 extend into the wire receiving areas 44. The cover section 40 comprises a latch section 48 and projecting wire contact sections 50. The latch section 48 is adapted to engage a latch on the side of the base section 38 to latch the cover section 40 in a closed position as shown in FIG. 1. As illustrated in phantom lines in FIG. 4, when the cover section 40 is located in an open position, the wires 14' can be placed above the wire receiving areas 44 against the top sides of the snap lock latch sections 46. When the cover section 40 is moved to its closed position, the wire contact sections 50 push downward against the wires to move the wires 14 into the wire receiving areas 44 and into electrical connection with the wire connection sections 26 of the lead frames 22. As the wire contact sections 50 move downward, the wire connection sections 50 snap lock connect with the snap lock latch sections 46 to retain the wires 14 in electrical connection with the wire connection sections 26. This forms a strain relief connection for the wires with the housing. In an alternate method, the wires could be completely inserted into the wire receiving areas and the cover then subsequently moved to its closed position. In alternate embodiments, any suitable type of housing could be provided. In the addition, any suitable method for attaching and/or retaining the wires on the lead frames could be provided.

The IDC filtration device of the present invention helps solve the problem of creating a filtered line or system without costly modifications to existing connector assemblies. The fundamentals of the design include (but are not limited to) an overmolded, stitched (inserted), or mechanically retained set of metallic contacts or lead frames, one or more filtration chips (depending on the application), and the plastic housing used to encase the components as well as strain relieve the wire.

The general idea behind the design is to adhere the module to an existing wire harness. The metallic contacts or lead frames also act as a crimp fashioned in such a way as to strip away the insulation of a discrete wire when pressed into place. This is commonly known in the industry as an Insulation Displacement Crimp (IDC) and is generally used to make electrical contact without having to go through the labors of stripping the insulation in order to access the copper stranding for contact. This makes for a very cost effective termination and connection solution.

The logistics for the IDC filtration module assembly shown are quite simplistic for this specific application. However, the base concept may proliferate itself to span other variations while still maintaining the original intent.

Figure 5:
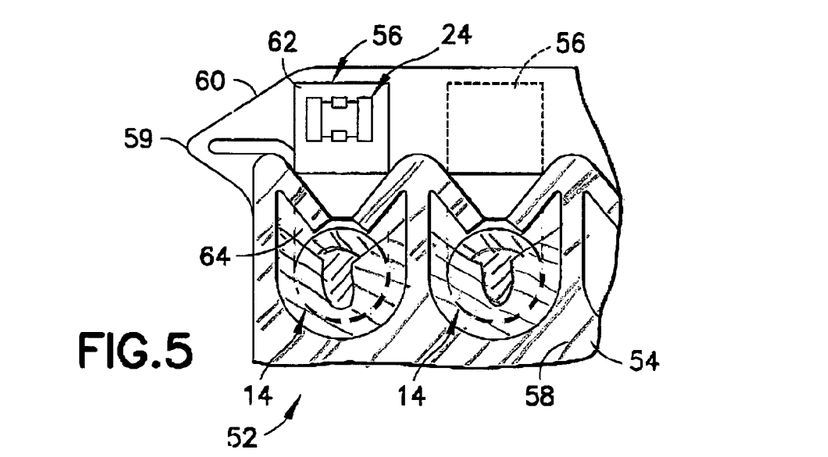
FIG. 5 is a schematic cross sectional view of an alternate embodiment of a filter assembly incorporating features of the present invention.

Referring now to FIG. 5, an alternate embodiment of the present invention is shown. In this embodiment, the filter assembly 52 generally comprises a housing 54, wires 14 and filter subassemblies 56. The housing 54 comprises a base section 58 and a cover section 60 which are connected to each other by a living hinge 59. The filter subassemblies 56 each comprises a lead frame 62 and a filter circuit 24. The filter subassemblies 56 are connected to the cover section 60, such as overmolding the cover section on a portion of the filter subassembly, rather than the base section 58. The lead frame 62 comprises an IDC wire connection section 64 which projects outward from the cover section. When the cover section 60 is moved to its closed position on the base section 58, the IDC wire connection sections 64 are adapted to pierce through the insulation on the wires 14 and make electrical connection with the conductors of the wires. This embodiment illustrates that the filter subassemblies can be attached to the cover section rather than the base section.

Figure 6:
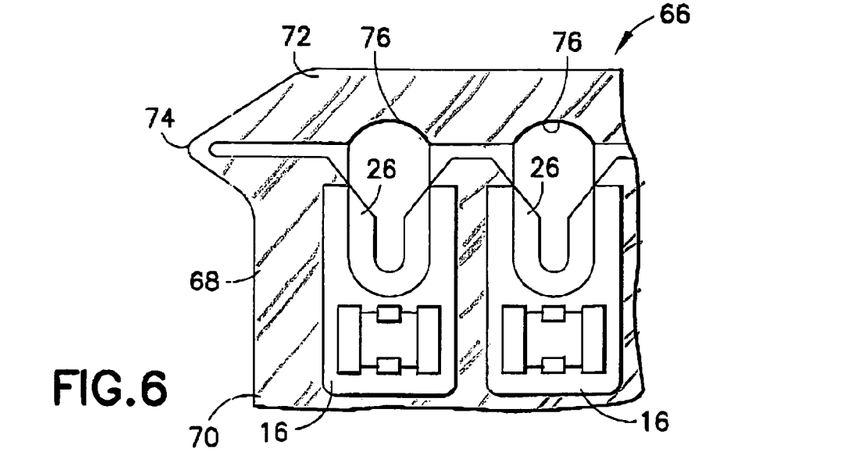
FIG. 6 is a schematic cross sectional view of another alternate embodiment of a filter assembly incorporating features of the present invention.

Referring now to FIG. 6, another alternate embodiment of the present invention is shown. In this embodiment, the filter assembly 66 generally comprises a housing 68, wires 14 (not shown) and filter subassemblies 16. The housing 68 comprises a base section 70 and a cover section 72 which are connected to each other by a living hinge 74. The filter subassemblies 16 are connected to the base section 70, such as overmolding the base section on portions of the filter subassemblies. The IDC wire connection sections 26 of the lead frames project into respective ones of the wire receiving areas of the base section 70. In this embodiment, the housing 68 does not comprise the snap lock latch sections 46 or the projecting wire contact sections 50. Instead, the cover section 72 comprises wire contact sections 76 which do not project outward from the cover section 72. This embodiment illustrates that the housing does not need to comprise projecting wire contact sections on the cover section or snap lock connection sections inside the wire receiving areas of the base sections.

Figure 7:
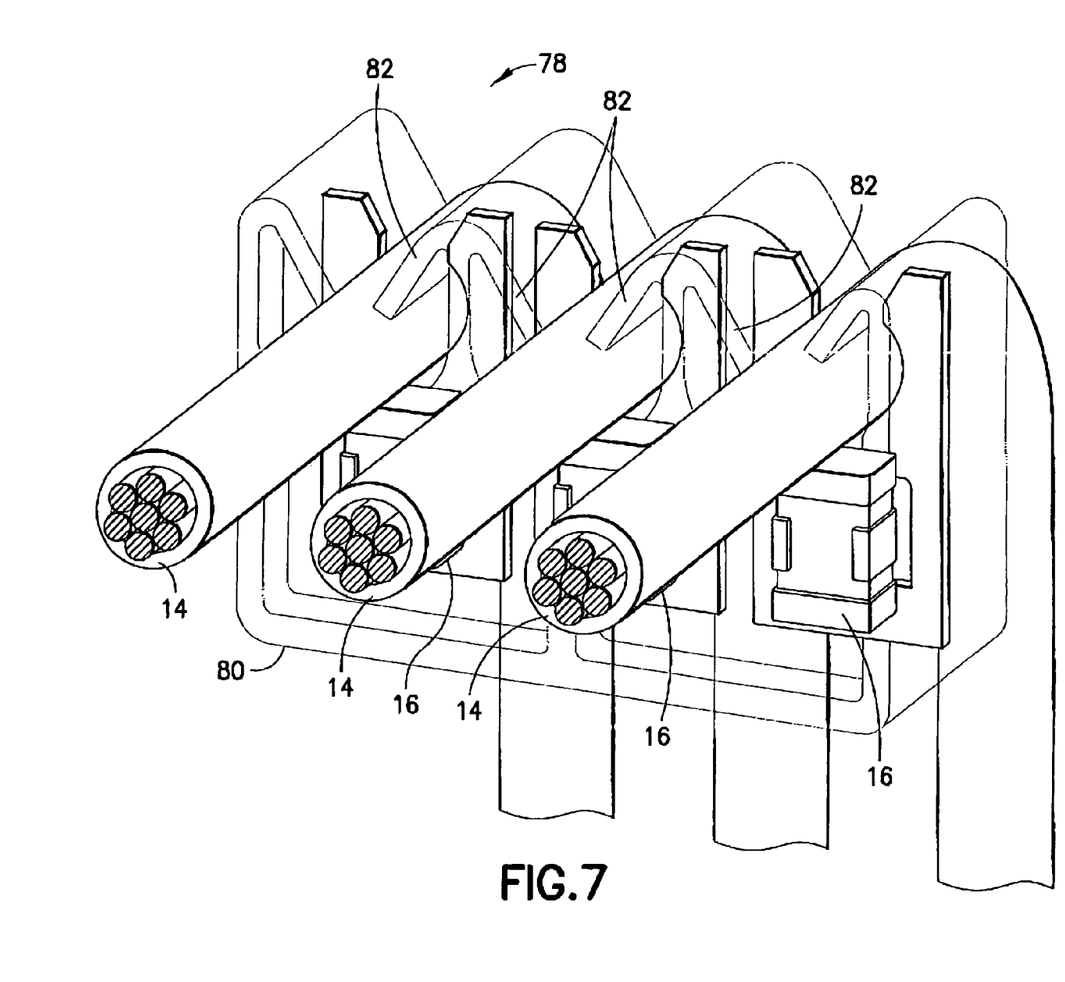
FIG. 7 is a perspective view of an alternate embodiment of a filter assembly incorporating features of the present invention.

Referring now to FIG. 7, another alternate embodiment of the present invention is shown. In this embodiment the filter assembly 78 comprises three of the wires 14 and three of the filter subassemblies 16. Each one filter subassemblies 16 is electrically coupled to a respective one of the wires 14. The housing 80 is a one-piece member which is overmolded onto the filter subassemblies 16. The housing 80 comprises openings through the top of the housing which the wires 14 can be pressed through into wire receiving areas and into of electrical connection with the wire connection sections of the lead frames of the filter subassemblies 16. The housing 80 comprises latch sections 82 extending downward at the top of the wire receiving areas. The latch sections 82 comprise the same shape as the latch sections 46 described above and form retainers for the wires after they are inserted, as well as forming strain relief sections on the housing for the wires. The housing 80, filter subassemblies 16 and portions of the wires 14 could be subsequently located into a surrounding housing, such as an electrical connector housing. When the wires 14 are pressed into connection with the wire connection sections 26 of the lead frames 22, the latch sections 82 can latch behind the top sides of the wires to retain the wires in connection with the IDC wire connection sections 26 and can form a wire strain relief. This embodiment illustrates that the housing does not need to comprise a cover section.

Figure 8:
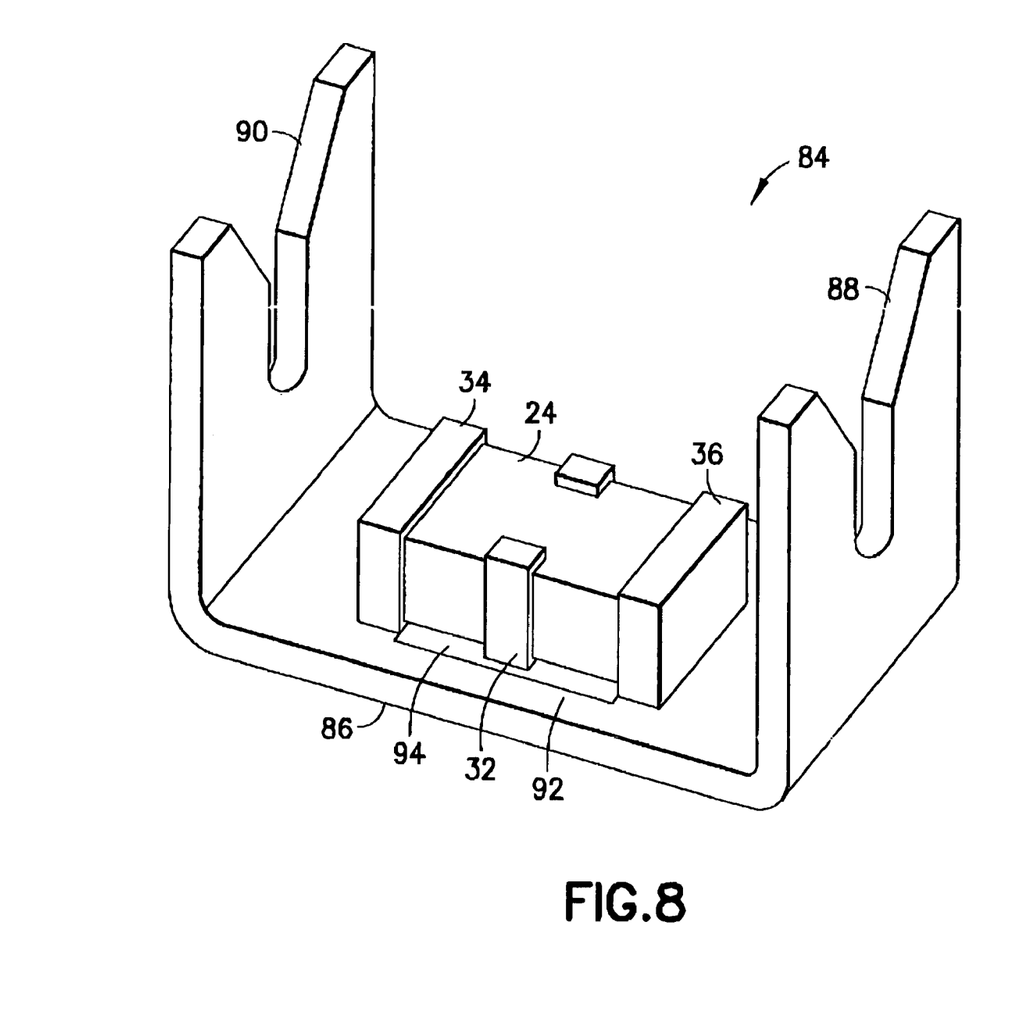
FIG. 8 is a perspective view of an alternate embodiment of a filter subassembly.

Referring now to FIG. 8, an alternate embodiment of a filter subassembly is shown. The filter subassembly 84 generally comprises a lead frame 86 and a filter circuit 24. The lead frame 86 is preferably comprised of sheet metal which is stamped and formed into the shape shown. The lead frame 86 comprises two IDC wire connection sections 88, 90 and a filter circuit connection section 92 located between the two IDC wire connection sections 88, 90. The two IDC wire connection sections 88, 90 could be attached to a single wire to provide redundant connection, or could be used to respectively connect to two different wires. The filter circuit connection section 92 comprises a hole 94.

The filter circuit 24 has a plurality of capacitors as described above, and has its two end terminals 34, 36 surface mounted, such as soldered, to the lead frame 86. The ground terminal 32 is spaced from the lead frame by the hole 94 in the lead frame. The hole in the lead frame also provides access for easier mounting of the filter circuit. In an alternate embodiment, a hole in the lead frame might not be provided, such as if another type of electrical insulator is provided between the ground terminal of the filter circuit and the lead frame. In addition, any suitable means or system could be used to attach the filter circuit to the lead frame; it need not be surface mounted or merely surface soldered.

Figure 9:
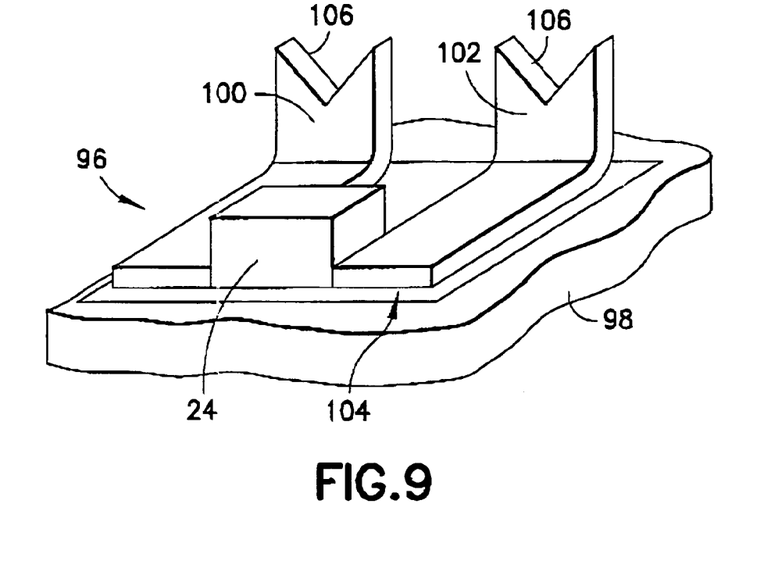
FIG. 9 is a perspective view of a portion of a filter assembly of an alternate embodiment of the present invention.

Referring now to FIG. 9, another alternate embodiment of the present invention is shown. In this embodiment the filter assembly 96 comprises a housing 98, two lead frames 100, 102, the filter circuit 24, and a metalized surface 104. The housing 98 is preferably comprised of a molded plastic or polymer material. The housing 98 could comprise an electrical connector housing. The metalized surface 104 is formed on the housing 98. The lead frames 100, 102, are connected to the metalized surface 104. The filter circuit 24 is also connected to the metalized surface 104. Preferably, an insulator is provided between the ground contact of the filter circuit and the metalized surface 104, or the metalized surface 104 could be absent proximate the location of the ground contact of the filter circuit 24. The lead frames 100, 102 comprises wire connection sections 106. The wire connection sections 106 can comprise IDC connection sections.

Figure 10:
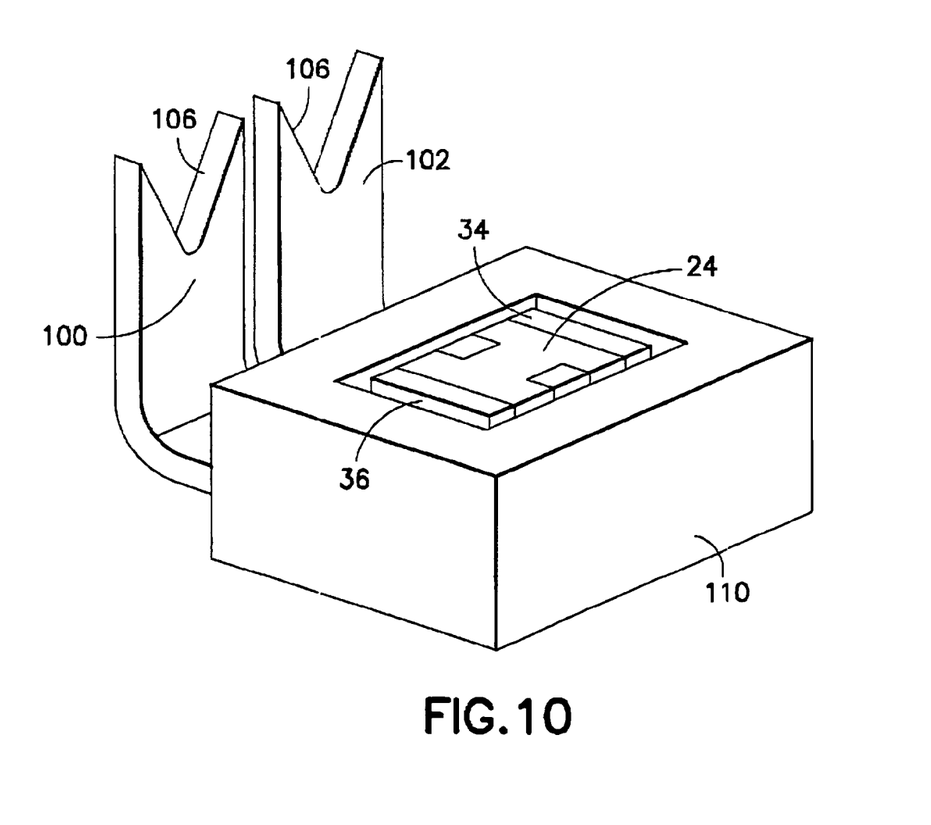
FIG. 10 is a perspective view of another alternate embodiment of a filter assembly incorporating features of the present invention.

Referring now to FIG. 10, another alternate embodiment of the present invention is shown. The filter assembly 108 comprises two lead frames 100, 102, a filter circuit 24, and a housing 110. The housing 110 is preferably an overmolded housing which is overmolded onto the lead frames 100, 102 and/or the filter circuit 24. The overmolded housing 110 could comprise a connector body or a separate block. The lead frames 100, 102 are preferably attached, such as by soldering or another method, to the filter circuit after the overmolded housing is overmolded onto the filter circuit. Alternatively, the lead frames could be attached to the filter circuit after the overmolded housing is overmolded onto the lead frames. The end terminals 34, 36 of the filter circuit could be connected to respective ones of the lead frames 100, 102. The end terminals 34, 36 could alternatively be coupled to both of the lead frames 100, 102.

Figure 11:
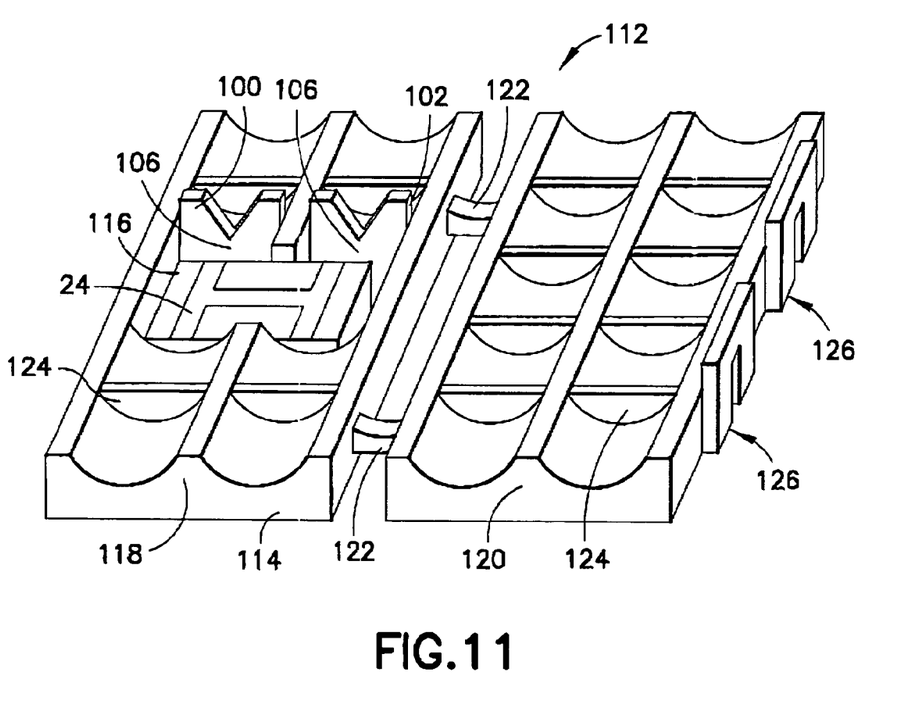
FIG. 11 is a perspective view of another alternate embodiment of a filter assembly provided in a splice electrical connector incorporating features of the present invention.

Referring now to FIG. 11, another alternate embodiment of the present invention is shown. The filter assembly 112 generally comprises a housing 114, and a filter subassembly 116. The filter subassembly 116 comprises one filter circuit 24 and two of the lead frames 100, 102. The housing 114 comprises a pocket which is sized and shaped to receive the filter subassembly and stationarily locate the lead frames 100, 102 in fixed positions in the housing. The housing 110 comprises two housing components 118, 120 which are connected to each other by living hinges 122. The housing components 118, 120 each comprise two wire receiving channels having wire strain relief projections 124 in the channels. The housing component 120 is adapted to be folded at the living hinges 122 onto the housing component 118 in a general clamshell configuration. Lock latches 126 can retain the two housing components 118, 120 in a closed and locked position. This type of assembly can be used to provide a filtered cable splice connector for connecting two cables to each other with the addition of a filter circuit in the spice connector.

The lead frames 100, 102 could be soldered or otherwise connected to the filter circuit 24 before insertion into the housing 110. However, with this type of embodiment, the filter circuit 24 could merely be placed on top of the lead frames 100, 102 and subsequently retained against the lead frames when the wires are located inside the housing and the cover of the housing is closed. The lead frames 100, 102 preferably comprise IDC connection sections 106 to make an electrical connection with the cables.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An electrical filter assembly comprising:
a housing;
at least one electrical wire extending into the housing;
a filter subassembly on the housing, the filter subassembly comprising a lead frame and a filter circuit connected to the lead frame, the filter circuit having a chip comprising a plurality of capacitors, wherein the chip is attached to the lead frame, wherein the lead frame comprises at least one insulation displacement contact (IDC) section which makes electrical connection with the at least one electrical wire.

2. An electrical filter assembly as in claim 1 wherein the filter subassembly comprises a metalized area on the housing coupling the filter circuit to the lead frame.

3. An electrical filter assembly as in claim 1 wherein the lead frame comprises two of the IDC sections which are sized and shaped to make electrical connection with a single one of the at least one wire.

4. An electrical filter assembly as in claim 1 wherein the lead frame comprises two of the IDC sections which are sized and shaped to make respective electrical connection with two wires of the at least one wire.

5. An electrical filter assembly as in claim 1 wherein the housing comprises a first housing member with at least one wire receiving area, wherein the IDC section is located in the wire receiving area, and wherein the housing comprises a strain relief at the wire receiving area.

6. An electrical filter assembly as in claim 5 wherein the housing comprises a second housing member which is mounted to the first housing member, and wherein the second housing member forms at least a portion of the strain relief.

7. An electrical filter assembly as in claim 6 wherein the first housing member comprises a snap lock section at the wire receiving area.

8. An electrical filter assembly as in claim 1 wherein the housing comprises a first housing member with the filter subassembly therein, and a second housing member movably connected to the first housing member, wherein the second housing member is adapted to close an entrance into a wire receiving area of the first housing member when the second housing member is moved to a latched position relative to the first housing member.

9. An electrical filter assembly as in claim 1 wherein the chip comprises at least some of the capacitors connected in parallel.

10. An electrical filter assembly comprising:
a housing;
at least one electrical wire extending into the housing;
a filter subassembly on the housing, the filter subassembly comprising a lead frame and a filter circuit connected to the lead frame, the filter circuit having a plurality of capacitors attached to the lead frame, wherein the lead frame comprises at least one insulation displacement contact (IDC) section which makes electrical connection with the at least one electrical wire,
wherein the filter subassembly comprises an overmolded housing member of the housing which is overmolded onto the lead frame and/or the filter circuit.

11. An electrical filter assembly comprising:
a housing;
at least one electrical wire extending into the housing;
a filter subassembly on the housing, the filter subassembly comprising a lead frame and a filter circuit connected to the lead frame, the filter circuit having a plurality of capacitors attached to the lead frame, wherein the lead frame comprises at least one insulation displacement contact (IDC) section which makes electrical connection with the at least one electrical wire,
wherein the housing comprises two housing members attached by a living hinge, wherein the living hinge is folded to fold the two housing members onto each other and capture the filter subassembly between the two housing members.

12. An electrical filter assembly comprising:
a housing;
at least one electrical wire extending into the housing;
a filter subassembly on the housing, the filter subassembly comprising a lead frame and a filter circuit connected to the lead frame, the filter circuit having a plurality of capacitors attached to the lead frame, wherein the lead frame comprises at least one insulation displacement contact (IDC) section which makes electrical connection with the at least one electrical wire,
wherein the at least one electrical wire comprises a plurality of the wires, wherein the electrical filter assembly comprises a plurality of the filter subassemblies, and wherein the filter subassemblies are connected to respective ones of the wires.

13. An electrical filter assembly comprising:
a housing;
at least one electrical wire extending into the housing;
a filter subassembly on the housing, the filter subassembly comprising a lead frame and a filter circuit connected to the lead frame, the filter circuit having a plurality of capacitors attached to the lead frame, wherein the lead frame comprises at least one insulation displacement contact (IDC) section which makes electrical connection with the at least one electrical wire,
wherein the filter circuit comprises a filter circuit module having contact areas of the capacitors mounted to the lead frame and a contact area of a ground of the module insulated from the lead frame by an air gap formed in the lead frame.

14. An electrical filter subassembly comprising:
a lead frame comprising an electrically conductive section with a wire connection section and a filter circuit connection section, wherein the wire connection section comprises at least one insulation displacement connection (IDC) section adapted to pierce through insulation of at least one wire to contact an electrical conductor of the at least one wire; and
a filter circuit module connected to the filter circuit connection section of the lead frame, wherein the filter circuit module comprises a chip including a plurality of capacitors.

15. An electrical filter assembly comprising:
a housing; and
an electrical filter subassembly as in claim 14 connected to the housing, wherein the lead frame comprises a metalized area on the housing.

16. An electrical filter subassembly as in claim 14 wherein the filter subassembly comprises an overmolded housing member which is overmolded onto the lead frame and/or the filter circuit module.

17. An electrical filter subassembly as in claim 14 wherein the filter circuit module comprises contact areas of the capacitors mounted to the lead frame and a contact area of a ground of the module insulated from the lead frame by an air gap formed in the lead frame.

18. An electrical filter subassembly as in claim 14 wherein the lead frame comprises two of the IDC sections which are sized and shaped to make electrical connection with a single one of the at least one wire.

19. An electrical filter assembly comprising:
a housing; and
an electrical filter subassembly as in claim 14 connected to the housing,
wherein the housing comprises a first housing member and a second housing member, wherein the first housing member comprises with a wire receiving area, wherein the IDC section extends into the wire receiving area, and wherein the second housing member covers an entrance into the wire receiving area.

20. An electrical filter assembly as in claim 19 wherein the second housing member is attached to the first housing member by a living hinge.

21. A method of coupling a filter to an electrical wire comprising steps of:
providing an electrical filter subassembly comprising a lead frame and a filter circuit module, wherein the lead frame comprises an insulation displacement connection (IDC) section adapted to pierce through insulation of a wire to contact an electrical conductor of the wire, and wherein the filter circuit module comprises a chip including a plurality of capacitors electrically coupled to the lead frame; and
inserting the wire into the IDC section of the lead frame comprising the IDC section piercing through the insulation of the wire to contact the electrical conductor of the wire and thereby couple the capacitors of the filter circuit module to the electrical conductor of the wire.

* * * * *